United States Patent
Sandhu et al.

[11] Patent Number: 6,063,700
[45] Date of Patent: May 16, 2000

[54] METHOD OF FORMING OHMIC CONDUCTIVE COMPONENTS IN A SINGLE CHAMBER PROCESS

[75] Inventors: Gurtej S. Sandhu; Sujit Sharan, both of Boise, Id.

[73] Assignee: Micron Technology, Inc., Boise, Id.

[21] Appl. No.: 09/032,414

[22] Filed: Feb. 27, 1998

[51] Int. Cl.[7] .................................................. H01L 21/44
[52] U.S. Cl. ........................... 438/597; 438/584; 438/683
[58] Field of Search .................................. 438/584, 597, 438/682, 683, 680, 649; 257/751, 754, 757

[56] References Cited

U.S. PATENT DOCUMENTS

| | | |
|---|---|---|
| 4,748,826 | 6/1988 | Laumen . |
| 5,168,332 | 12/1992 | Kunishima et al. . |
| 5,322,809 | 6/1994 | Moslehi . |
| 5,384,285 | 1/1995 | Sitaram et al. . |
| 5,545,574 | 8/1996 | Chen et al. . |
| 5,644,185 | 7/1997 | Miller . |
| 5,722,249 | 3/1998 | Miller, Jr. . |
| 5,834,846 | 11/1998 | Shinriki et al. . |
| 5,877,085 | 3/1999 | Matsubara . |
| 5,882,975 | 3/1999 | Ishikawa . |

OTHER PUBLICATIONS

Tung et al. "Formation of Ultrathin Single–Crystal Silicide Films on Si: Surface and Interfacial Stabilization of Si–NiSi2 Epitaxial Structures", Physical Review Letters, vol 50, No. 6, p429, Feb. 7, 1983.

Stanely Wolf and Richard Tauber, Silicon Processing for the VLSI Era, vol. 1, p 386–399, vol. 2, p164–165, 1990.

Walter J. Moore, Physical Chemistry, p48–49, 1972.

Robert H. Perry, et al. Perry's Chemical Handbook, Sixth Edition, p 3–107 to 3–110, 1973.

Kamoshida, Kazuyoshi and Kunio, Saito, "Self–aligned TiN Formation by $N_2$ Plasma Bias Treatment of $TiSi_2$ Deposited by Selective Chemical Vapor Deposition," *Jpn. J. Appl. Phy.* vol. 36 (1997) pp. 642–647, Part 1, No. 2, Feb., 1997.

*Primary Examiner*—Charles Bowers
*Assistant Examiner*—Evan Pert
*Attorney, Agent, or Firm*—Dorsey & Whitney LLP

[57] ABSTRACT

A single chamber process to form ohmic conductive components for high aspect ratio holes and openings comprising the steps of supplying a microelectronic substrate to a chamber, heating the microelectronic substrate, depositing a conductor, such as titanium, onto the heated microelectronic substrate, by for example CVD, and raising the pressure of an atmosphere in the chamber, wherein the pressure is raised to: i) at least approximately 100 Torr; ii) until a silicide forms on the microelectronic substrate; or iii) until the temperature of the microelectronic substrate is at least equal to approximately 675° C.

8 Claims, 3 Drawing Sheets

METHOD OF FORMING OHMIC CONDUCTIVE COMPONENTS IN A SINGLE CHAMBER PROCESS

TECHNICAL FIELD

The present invention relates to forming features in the manufacturing of microelectronic devices. More specifically, the present invention relates to the fabrication of low resistance ohmic conductive components on a microelectronic substrate.

BACKGROUND OF THE INVENTION

Microelectronic devices are used in computers, communications equipment, televisions and many other products. Typical microelectronic devices include processors, memory devices, field emission displays and other devices that have circuits with small, complex components. In current manufacturing processes, the components of such circuits are generally formed on a microelectronic substrate or wafer with conductive, insulative and semiconductive materials. Each mircoelectronic substrate typically has 50–200 microelectronic devices, and each microelectronic device may have several million components.

Because fabricating microelectronic devices generally involves forming electrical components at a number of layers and different locations, microelectronic devices generally have many conductive features to couple the various components together. Common conductive features in microelectronic devices include low resistance ohmic contacts, vias, runners, damascene lines, plugs, dual-damascene lines and other highly conductive components. The ohmic conductive components are formed in openings formed in an insualting layer which covers a base layer. The base layer is often a silicon wafer, and the insulating layer often takes the form of an oxide, such as a silicon oxide.

Currently, a multi-step, multi-chamber process has been used to form ohmic conductive components on microelectronic substrates. In the first step, a conductor, such as titanium, is deposited on a microelectronic substrate. The conductor is deposited so as to make contact with a base layer of the microelectronic substrate wherever a hole or opening has been formed in an insulating layer overlying the base layer. A variety of methods may be employed for depositing the conductor, although chemical vapor deposition (CVD) is typically used. The deposition takes place in a process chamber. The conductor is deposited at wafer temperatures of between 550 and 625° C. In the second step, the microelectronic substrate is transferred to a furnace for annealing. Annealing is most often accomplished by rapid thermal processing (RTP). Rapid thermal processing involves a short time, high temperature technique wherein the microelectronic substrate is heated using radiant light. The microelectronic substrate is usually thermally isolated so that radiant, rather than conductive heating and cooling, is dominant. The temperature in rapid thermal processing will exceed 675° C., annealing the conductor and the base layer and thus forming the ohmic conductive component in the hole or opening. Most of the heating in RTP takes place in a substantially non-oxidizing atmosphere. Often, nitrogen and argon are the components of the atmosphere. Heating may also take place in a vacuum.

The multi-chamber process presents several problems. The microelectronic substrate is exposed to contamination when transferred between chambers. The contamination may take the form of oxygen, water vapor or other contaminates. Exposure to contamination can be reduced by transferring the microelectronic substrate in an inert atmosphere, however this can be a time consuming and costly process. The microelectronic substrate is also potentially exposed to static electricity which can ruin the substrate. The transfer between chambers causes the microelectronic substrate to cool between the deposition and annealing steps. Cooling results in an increase in manufacturing costs since additional energy must be supplied to reheat the substrate. Cooling may also lead to poor contact formation due to the thermal expansion and contraction of the contact or via between steps.

A single step or a single chamber process for the fabrication of low resistance ohmic conductive components would greatly increase the efficiency of microelectronic device fabrication, both in terms of the cost and in terms of the quantity which can be produced in a given time. Applicants have recognized that one solution would be a single step/single chamber process in which a conductor is deposited by chemical vapor deposition onto a microelectronic substrate having a substrate temperature greater than 675° C. While this improves the efficiency of the fabrication process, substrate temperatures approaching 675° C. are difficult to achieve due to physical constraints of existing hardware. The substrate temperature is dependent upon the conduction of heat from a heated substrate holder, which also known in the industry as a susceptor. The susceptor would have to be driven to temperatures of 700° C. and above to achieve sufficiently high substrate temperatures to anneal the conductor with the base layer. Current susceptor hardware designs are incapable of being driven to such high temperatures.

SUMMARY OF THE INVENTION

Applicants have solved the problem by heating a microelectronic substrate in a chamber to a substrate temperature of between approximately 550° C. and approximately 625° C., depositing a conductor, such as titanium, by for example, chemical vapor deposition (CVD), onto the heated microelectronic substrate and into an opening formed in an insulating layer thereof, and raising the pressure of an ambient or atmosphere in the chamber. The pressure of the atmosphere may be raised until either: (i) the pressure is equal to or greater than approximately 100 Torr; (ii) a silicide forms on the microelectronic substrate; or, (iii) the substrate temperature is at least equal to approximately 675° C.

The pressure in the chamber may initially be between a vacuum and atmospheric pressure. A substantially non-oxidizing environment should be provided within the chamber. The atmosphere in the chamber may thus consist substantially of gases such as ammonia, nitrogen, argon or a combination of nitrogen and argon, or any other non-oxidizing gas. The pressure in the chamber is then raised by introducing an additional quantity of non-oxidizing gas into the chamber. The introduction of additional gas rapidly raises the substrate temperature to above 675° C. and anneals the conductor deposited on the microelectronic substrate. The annealing causes the conductor deposited on a base layer through the opening in the insulating layer, to form a silicide, such as titanium silicide ($TiSi_2$). Thus a low resistance ohmic contact or via is formed in a single chamber without RTP or furnace annealing.

The use of nitrogen, or a gas containing nitrogen, to pressurize the chamber provides the additional benefit of forming a passivation layer on the surface of the microelectronic substrate. The titanium and nitrogen gas interact to form a thin layer of titanium nitride (TiN) on the microelectronic substrate surface. The passivation layer prevents the growth of oxides, such as titanium oxides, on the microelectronic substrate.

Preferably the process is performed in a single chamber, although a multiple chamber approach may be employed. In a multiple chamber approach, the microelectronic substrate should be transferred from the first chamber to a second chamber in either a vacuum or a substantially non-oxidizing atmosphere to prevent oxides from forming before the anneal.

DETAILED DESCRIPTION OF THE INVENTION

In the following description, certain specific details are set forth in order to provide a thorough understanding of various embodiments of the present invention. However, one skilled in the art will understand that the present invention may be practiced without these details. In other instances, well-known structures associated with microelectronic devices and with the fabrication of microelectronic devices, such as CVD apparatus, have not been shown in detail in order to avoid unnecessarily obscuring the description of the embodiments of the invention.

Figure 1:
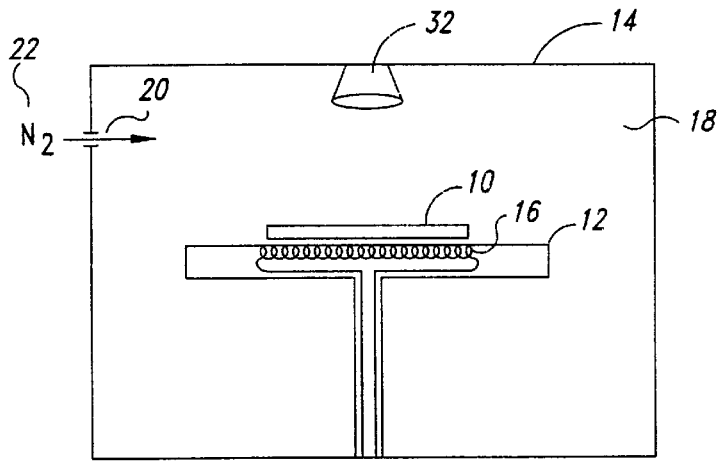
FIG. 1 is a side elevational view of an apparatus for performing the invention.

With reference to FIG. 1, an exemplary structure for practicing the invention is shown in which a microelectronic substrate 10 is seated on a susceptor 12 in a chamber 14. The susceptor 12 is heated by a heating element 16. The interior 18 of the chamber 14 is preferably evacuated, although it may be at atmospheric pressure. The interior 18 of the chamber 14 preferably contains a non-oxidizing gas such as ammonia ($NH_3$), nitrogen, argon, a combination of nitrogen and argon, or any other non-oxidizing gas or combination thereof. The environment should be substantially free of sources of reactive oxygen, such as ambient air and moisture, to prevent the formation of sufficient amounts of oxide on the microelectronic substrate 10 to interfere with the performance of the microelectronic substrate 10. A port 20 is shown for introducing gas 22 into the chamber 14. A chemical vapor disposition apparatus 32 is shown for depositing a conductive film on the microelectronic substrate 10.

Figure 2:
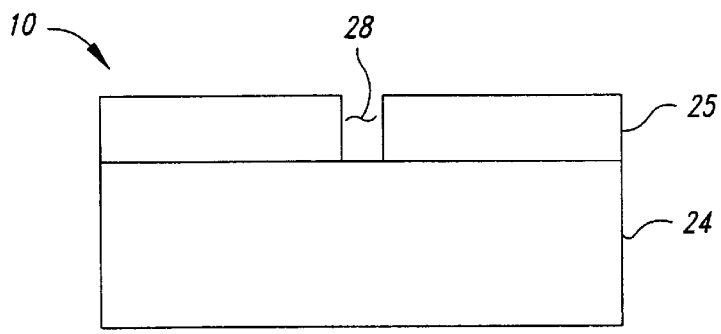
FIG. 2 is a partial schematic cross-sectional view of a substrate upon which an ohmic contact is to be fabricated according to an exemplary embodiment of a method in accordance with the invention.

With reference to FIG. 2, in the exemplary embodiment, the microelectronic substrate 10 initially includes a base layer 24 having other layers formed thereon. The microelectronic substrate 10 may be a semiconductor wafer or other type of substrate commonly used for fabricating microelectronic devices. The base layer 24 may be composed of silicon or other suitable materials. An insulating layer 25 may be formed on the base layer 24. The insulating layer 25 may be formed of a silicon oxide, such as silicon dioxide ($SiO_2$). An opening 28, may be formed in the insulating layer 25 for locating a contact therein. The opening 28 may be formed by patterning the insulating layer 25 with a resist material and then anisotropically etching the exposed portion of the insulating layer 25. The opening 28 illustrated in FIG. 2 is a contact hole, and the patterning and etching processses for forming the contact hole 28 are well known in the art. In many microelectronic devices, the opening 28 has an aspect ratio of 8:1 (i.e., the height of the opening is eight times the width or diameter of the opening).

Figure 3:
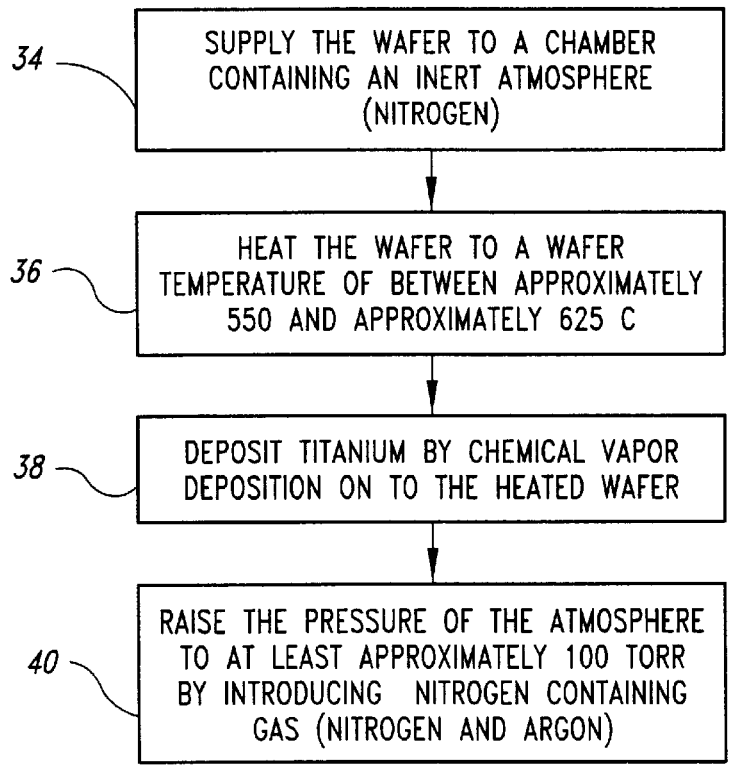
FIG. 3 is a flow chart of a first exemplary embodiment of a method in accordance with the invention, wherein the pressure of the atmosphere is raised to at least approximately 100 Torr.

With reference to FIG. 3, a first exemplary embodiment of a method according to the invention will be described. In step 34, the microelectronic substrate 10 is supplied to the chamber 14 and placed on the susceptor 12. The chamber 14 defines an enclosure containing a vacuum. In the exemplary embodiment, the atmosphere has an initial pressure of approximately less than 100 mTorr.

In step 36, the microelectronic substrate 10 is conductively heated through the susceptor 12 by the heating coil 16. The temperature of the microelectronic substrate 10 is raised to a substrate temperature of between approximately 550° C. and approximately 625° C.

Figure 4:
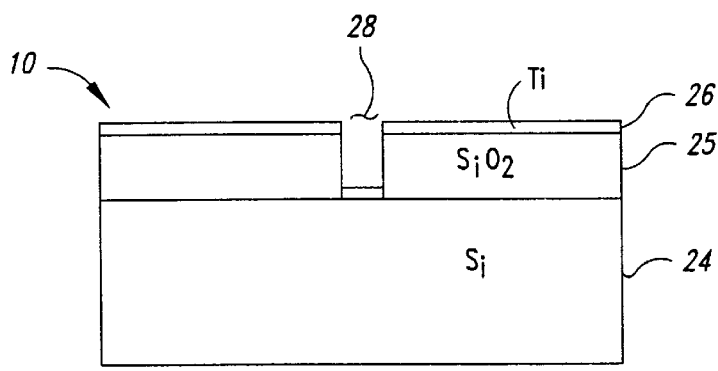
FIG. 4 is a partial schematic cross-sectional view of a substrate upon which a conducting layer has been deposited according to an exemplary embodiment of a method in accordance with the invention.

In step 38, a conducting film 26 is deposited onto the microelectronic substrate 10 and into the opening 28 (FIG. 4). The film may be deposited by means of chemical vapor deposition (CVD) by the chemical vapor deposition apparatus 32. Although the conducting film in the exemplary embodiment is titanium (Ti), other conductors such as aluminum (Al), tungsten (W), Platinum (Pt), Molybdenum (Mo), and Cooper (Cu) or an alloy composed of these conductors and silicon may be used. Various combinations of the above conductors may be employed in forming multi-layered ohmic contact structures.

Figure 5:
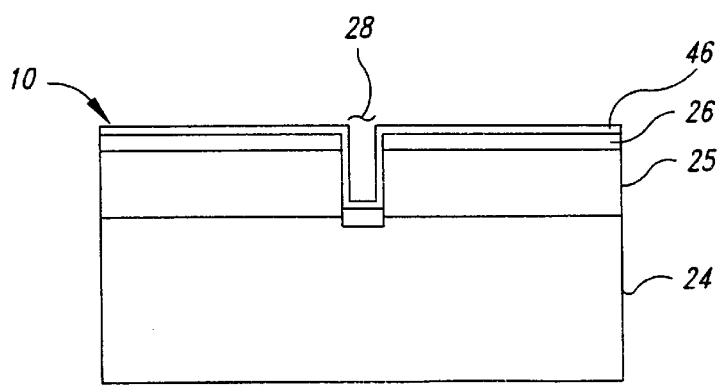
FIG. 5 is a partial schematic cross-sectional view of a substrate upon which a low resistance ohmic contact has been formed according to an exemplary embodiment of a method in accordance with the invention.

In step 40, the pressure in the interior 18 of the chamber 14 is increased to an annealing pressure of at least approximately 100 Torr. This may be accomplished by introducing additional gas 22, such as nitrogen, into the enclosure through port 20. (FIG. 1). The annealing pressure should be as high as is required to adequately raise the temperature of the interior 18 of the chamber 14. The increase in pressure causes the conductor 26 and the substrate 10 to rapidly reach an annealing temperature at which the conductor 26 anneals, thus forming a silicide by transforming the titanium (Ti) deposited in the opening 28, as well as, a portion of the base layer 24 proximate the titanium, into titanium silicide ($TiSi_2$). With reference to FIG. 5, the low resistance ohmic contact 30 is thus formed in the base layer 24 of the microelectronic substrate 10 at a bottom-most portion of the opening 28.

Passivation can be acheived by using nitrogen or a nitrogen containing gas, such as ammonia ($NH_3$), in the atmosphere 18 of the enclosure of the chamber 14. With reference to FIG. 5, the nitrogen and titanium combine to form a thin layer of titanium nitride (TiN) 46 on the surface of the microelectronic substrate 10, protecting the surface from oxidation.

Figure 6:
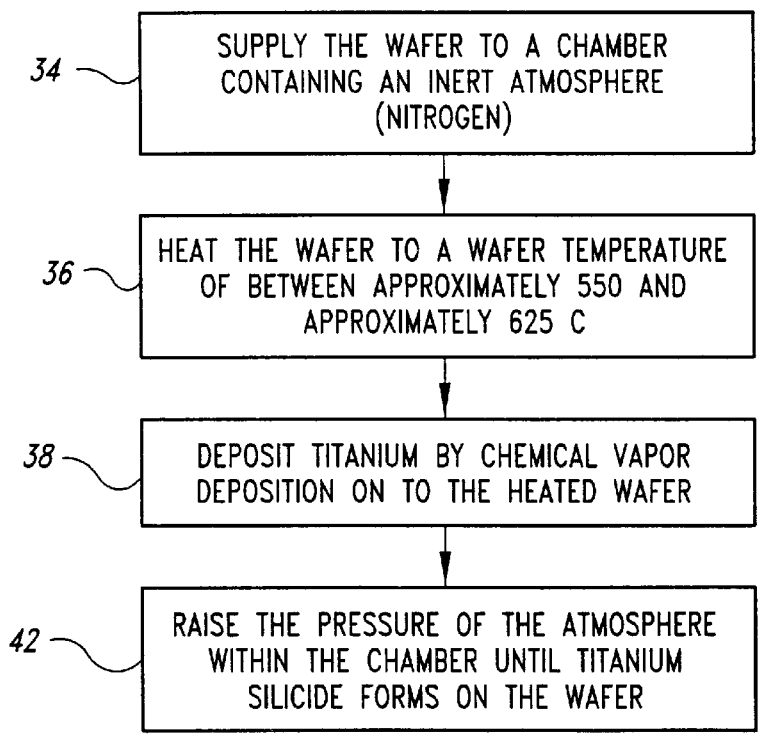
FIG. 6 is a second exemplary embodiment of the invention, wherein the pressure of the atmosphere is raised until a silicide forms on the microelectronic substrate.

FIG. 6 shows a second exemplary embodiment of a method according to the invention. The method of the second exemplary embodiment is similar to the method of the first exemplary embodiment, except for the last step. In step 42, the pressure of the atmosphere within the chamber is raised until titanium silicide (TiSi$_2$) forms in the opening 28 at the base layer 24.

Figure 7:
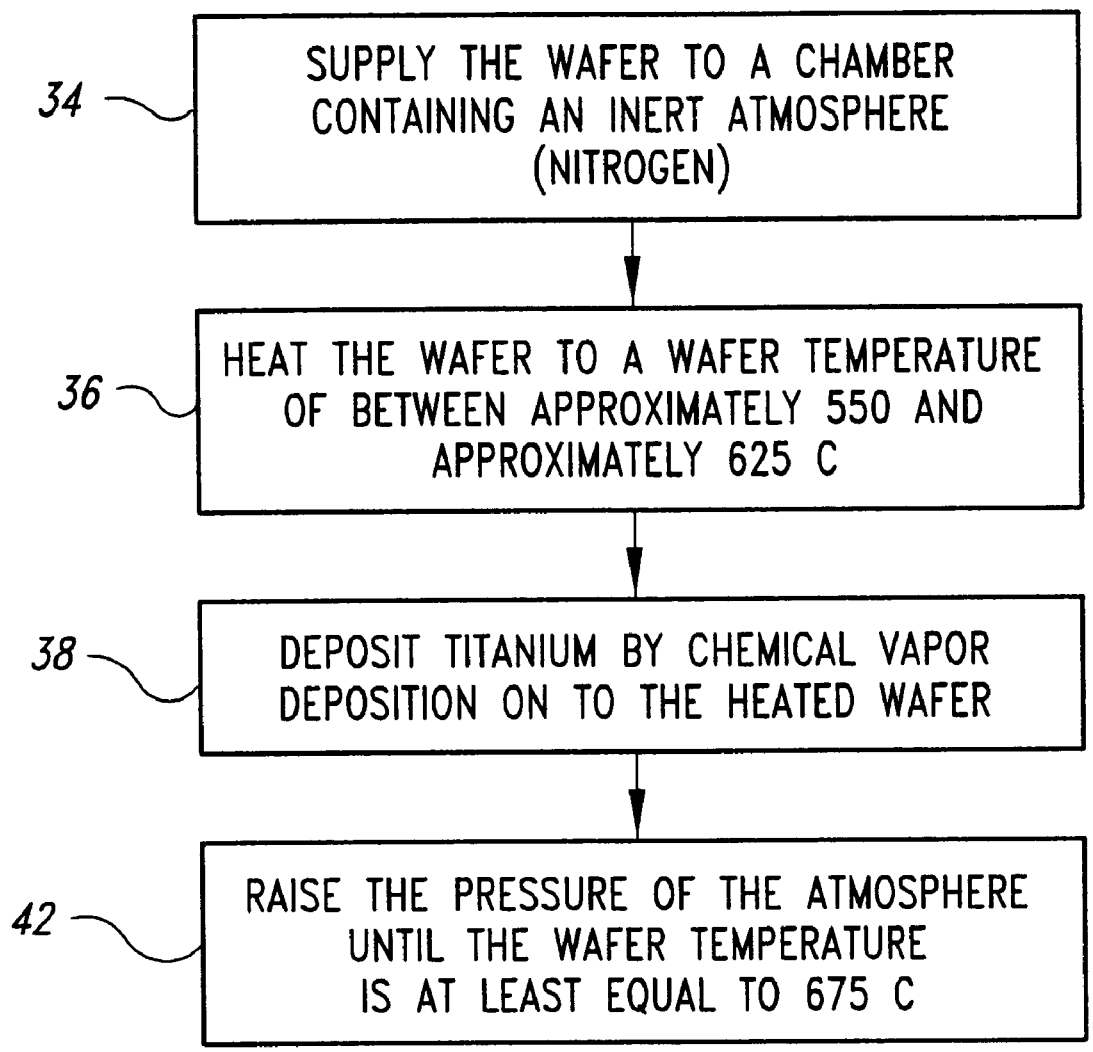
FIG. 7 is a flow chart of a third exemplary embodiment of the invention, wherein the pressure of the atmosphere is raised until a wafer temperature of at least approximately 675° C. is reached.

FIG. 7 shows a third exemplary embodiment of a method according to the invention. The method of the third exemplary embodiment is similar to the method of the first and second exemplary embodiments, except for the last step. In step 44, the pressure of the atmosphere within the chamber is raised until the substrate temperature of the microelectronic substrate 10 is at least equal to approximately 675° C.

It will be appreciated that, although embodiments of the invention have been described above for purposes of illustration, various modifications may be made without deviating from the spirit and scope of the invention. For example, the particular composition of the conductor and the method of deposition of the conductor described above should not be construed to unduly limit the composition and methods which accomplish the purpose of forming ohmic conductive components. Those skilled in the art will also appreciate that the structure and method taught in accordance with the present invention can be applied to devices and methods other than those associated with silicon wafer substrates and silicon dioxide insulating layers. Indeed, numerous variations are well within the scope of the invention. Accordingly, the scope of the invention is not limited by the disclosure of particular embodiments, and terms used in the following claims should not be construed to limit the invention to these embodiments. Instead, the scope of the invention is determined entirely by the following claims.

We claim:

1. A method of forming conductive components on a microelectronic substrate in a chamber, the method comprising the steps of:

supplying the microelectronic substrate to an interior of the chamber;

heating the microelectronic substrate to a substrate temperature of between approximately 550° C. and approximately 625° C.;

depositing a conductor onto the heated microelectronic substrate in the presence of an atmosphere; and after the depositing step, raising the pressure of the atmosphere in the interior of the chamber until the substrate temperature is at least equal to approximately 675° C.

2. The method of claim 1 wherein the depositing step includes the step of depositing titanium by chemical vapor deposition.

3. The method of claim 1 wherein the step of supplying the microelectronic substrate to an interior of the chamber includes the step of supplying a substantially non-oxidizing atmosphere in the interior of the chamber.

4. The method of claim 1 wherein the step of supplying the microelectronic substrate to an interior of the chamber includes the step of supplying a substantially non-oxidizing atmosphere which contains nitrogen in the interior of the chamber.

5. The method of claim 4 wherein the step of raising the pressure of the atmosphere comprises the step of introducing a substantially non-oxidizing gas containing nitrogen into the interior of the chamber.

6. The method of claim 1 wherein the step of supplying the microelectronic substrate to an interior of the chamber includes the step of supplying a substantially non-oxidizing atmosphere substantially consisting of NH$_3$ in the interior of the chamber.

7. The method of claim 1, further comprising the step of:

varying the temperature of the atmosphere in accordance with the step of raising the pressure in the interior of the chamber.

8. The method of claim 1 wherein the step of heating the microelectronic substrate comprises the step of:

conductively supplying heat to the microelectronic substrate.

* * * * *

UNITED STATES PATENT AND TRADEMARK OFFICE
CERTIFICATE OF CORRECTION

PATENT NO.    : 6,063,700  
DATED         : May 16, 2000  
INVENTOR(S)   : Gurtej S. Sandhu and Sujit Sharan Page 1 of 1

It is certified that error appears in the above-identified patent and that said Letters Patent is hereby corrected as shown below:

Title page,  
Other Publications,  
Line 8, "Perry's Chemical Handbook" should be -- Perry's Chemical Engineers' Handbook --

Signed and Sealed this

Thirteenth Day of November, 2001

Attest:

Attesting Officer

NICHOLAS P. GODICI  
Acting Director of the United States Patent and Trademark Office